United States Patent [19]
Chen et al.

[11] Patent Number: 5,602,404
[45] Date of Patent: Feb. 11, 1997

[54] LOW VOLTAGE TRIGGERING SILICON CONTROLLED RECTIFIER STRUCTURES FOR ESD PROTECTION

[75] Inventors: Hung-Sheng Chen; Chin-Miin Shyu; C. S. Teng, all of San Jose, Calif.

[73] Assignee: National Semiconductor Corporation, Santa Clara, Calif.

[21] Appl. No.: 374,135

[22] Filed: Jan. 18, 1995

[51] Int. Cl.⁶ .................... H01C 29/74; H01C 31/111; H01C 23/62
[52] U.S. Cl. .................. 257/112; 257/121; 257/356
[58] Field of Search .................... 257/112, 121, 257/356, 361

[56] References Cited

U.S. PATENT DOCUMENTS

| | | | |
|---|---|---|---|
| 3,231,796 | 1/1966 | Shandert | 257/112 |
| 4,437,107 | 3/1984 | Jonsson et al. | 257/112 |
| 4,631,561 | 12/1986 | Foroni et al. | 257/112 |
| 5,225,702 | 7/1993 | Chatterjee | 257/360 |
| 5,276,350 | 1/1994 | Merrill et al. | 257/603 |
| 5,343,053 | 8/1994 | Avery | 257/173 |
| 5,401,485 | 3/1995 | Anceau | 257/112 |

FOREIGN PATENT DOCUMENTS

| | | |
|---|---|---|
| 53-10285 | 1/1978 | Japan . |
| 55-68859 | 7/1980 | Japan . |

*Primary Examiner*—Stephen Meier
*Attorney, Agent, or Firm*—Limbach & Limbach L.L.P.

[57] ABSTRACT

Silicon controlled rectifier (SCR) structures are provided that are triggered by lightly doped diffusion (LDD) junction breakdown voltages of approximately 4–10 V. The SCR structures eliminate the need for the field plate diode and resistor secondary protection elements found in conventional SCR-based ESD protection circuits, thus minimizing RC delay on the signal line and reducing circuit size. The SCR structures are compatible with existing CMOS processes and are scalable to submicron technology.

4 Claims, 4 Drawing Sheets

LOW VOLTAGE TRIGGERING SILICON CONTROLLED RECTIFIER STRUCTURES FOR ESD PROTECTION

Background of the Invention

1. Field of the Invention

The present invention relates to electrostatic discharge (ESD) protection in integrated circuit structures and, in particular, to silicon controlled rectifier (SCR) structures that utilize lightly doped diffusion (LDD) junction breakdown as a low voltage trigger circuit.

2. Discussion of the Prior Art

FIG. 1 shows circuitry 10 for electrostatic discharge protection (ESD) of an integrated circuit structure. As shown in FIG. 1, ESD protection circuitry 10 includes a resistor R connected between a signal pad 12 and the internal circuits to be protected. The signal pad 12 is further connected to an anode of a silicon controlled rectifier (SCR) structure 14. The cathode of the SCR structure 14 is connected to ground. A field plate diode (FPD) 16 is connected between the signal line 18 to the internal circuits and ground. The FPD 16 has a breakdown voltage of approximately 15 V.

When a high voltage, i.e., approximately 15 V or greater, is applied to signal pad 12, the FPD 16 is the first element of the ESD protection circuitry 10 to break down, going into bipolar snapback. When this occurs, the current flow through resistor R determines the voltage build-up at signal pad 12 to turn on SCR 14 to provide an additional current path to ground for protection of the internal circuits. As shown in FIG. 2, after the SCR 14 turns on, the power dissipation in the SCR 14 is reduced with the anode-cathode potential clamped at a lower voltage $V_h$.

Although the FPD 16 responds to the 15 V level, in order to initiate the flow of current through the SCR structure 14, a trigger voltage of approximately 50 volts is required between its anode and its cathode. Because of the relatively small current flow through the resistor R, a very large resistor value is needed in order to obtain the required 50 V. A large resistor value is undesirable, however, because it results in consumption of large die area and increases RC delay, thus slowing down switching times on the signal line 18.

U.S. Pat. No. 5,225,702, issued Jul. 6, 1993, discloses a SCR structure, shown in FIG. 3, that is triggered by the n-well/p-well junction at approximately 50 V. In the FIG. 3 SCR structure 300, when the voltage at anode 302 is less than approximately 50 V relative to the voltage at cathode 304, the junction 306 between n-well 308 and p-type semiconductor region 310 is reverse biased such that very little current is conducted by the SCR structure 300. For current to be conducted, the voltage at the anode 302 must be at least approximately 50 V, relative to the voltage at cathode 304, in order to create avalanche production of carriers at the junction 306.

FIG. 4 shows an improved SCR structure 400 for use in ESD protection that is triggered by MOSFET snapback at approximately 15 V. SCR structure 400, also disclosed in the '702 patent, provides a lower trigger voltage of approximately 15 V because the electric field between heavily doped n+ region 402 and p-type semiconductor region 404 is higher than the electric field between lightly doped n-well 406 and p-type region 404. Thus, the avalanche production of carriers is created between n+ region 402 and p-type region 404 more easily than between n-well 406 and p-type region 404. Avalanche production of carriers between n+ region 402 and p-type region 404 provides a bias current to the base of the npn transistor defined by heavily doped n+ region 408 (emitter), p-type region 404 (base) and n-well 406 (collector), thereby turning on the npn transistor to initiate flow of current through SCR structure 400 from anode 410 to cathode 412.

Furthermore, the trigger voltage of the SCR structure 400 is reduced because a higher electric field is created across junction 414 between n-well 406 and p-type region 404 when the voltage at anode 410 is positive relative to the voltage at cathode 412. This is due to the fact that the voltage potential between anode 410 and cathode 412 drops across a relatively small distance as applied by polysilicon gate layer 416 across thin gate oxide 418 more proximate to the junction 414 between n-well 406 and p-type region 404.

However, the FIG. 4 approach still has the disadvantage of requiring large die area due to the need for resistor R and the field plate diode (FPD), with possible latent damage resulting from the high snapback voltage at the FPD. Furthermore, the FIG. 4 solution is not applicable to low-voltage integrated circuit technologies because of the thin gate oxide 418 utilized in these low voltage structures.

U.S. Pat. No. 5,276,350, issued Jan. 4, 1994, discloses a low reverse junction breakdown voltage zener diode structure, shown in FIG. 5, for ESD protection of integrated circuits. As shown in FIG. 5, the diode structure 500 includes a heavily doped N+ cathode region 502 and a heavily doped P+ anode region 504 formed in a N− or P− semiconductor substrate 506. A lightly doped diffusion (LDD) region 508 is formed between the cathode region 502 and the anode region 504. By using the LDD implant as part of the diode fabrication process, a zener diode with a breakdown voltage of approximately 6.6 V is created.

SUMMARY OF THE INVENTION

The present invention provides silicon controlled rectifier Structures that are triggered by lightly doped diffusion (LDD) junction breakdown voltages of approximately 4–10V. Various combinations of lightly doped nLDD/pLDD region$_s$ and heavily doped n+/p+ regions can be utilized to achieve the desired trigger voltage. The new SCR structures eliminate the need for the field plate diode and resistor secondary protection devices typically utilized in conventional SCR-based ESD protection circuits, thus reducing die area and minimizing RC delay on the signal line. The structures are compatible with existing CMOS processes and are scalable to submicron technology.

A better understanding of the features and advantages of the present invention will be obtained by reference to the following detailed description and accompanying drawings which set forth illustrative embodiments in which the principles of the invention are utilized.

DETAILED DESCRIPTION OF THE INVENTION

The following discussion describes silicon controlled rectifier (SCR) structures in accordance with the present invention. These SCR structures are described utilizing terms such as "n-well," "p-well," "heavily doped region" and "lightly doped region." Those skilled in the art of SCR structures will appreciate the relative quantitative differences in dopant concentration typically associated with these terms in the context of SCR structures. While it is not intended that the present invention be so limited, for purposes of the following discussion, the preferred concentrations associated with these terms are as follows: n-well/p-well $\sim10^{16}$ cm$^{-3}$, heavily doped (n+/p+) region $\sim10^{20}$ cm$^{-3}$, lightly doped (nLDD/pLDD) region $\sim10^{18}$ cm$^{-3}$.

Figure 1:
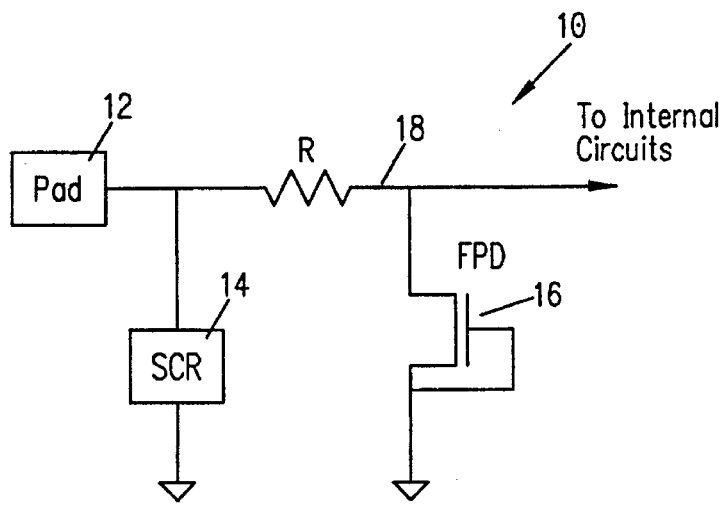
FIG. 1 is a schematic diagram illustrating a conventional SCR-based ESD protection circuit.
Figure 2:
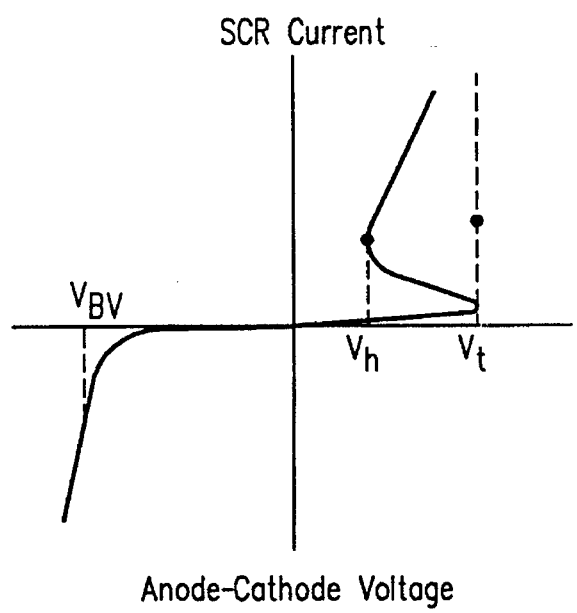
FIG. 2 is a graph illustrating anode-cathode voltage versus SCR current for a conventional SCR structure.
Figure 3:
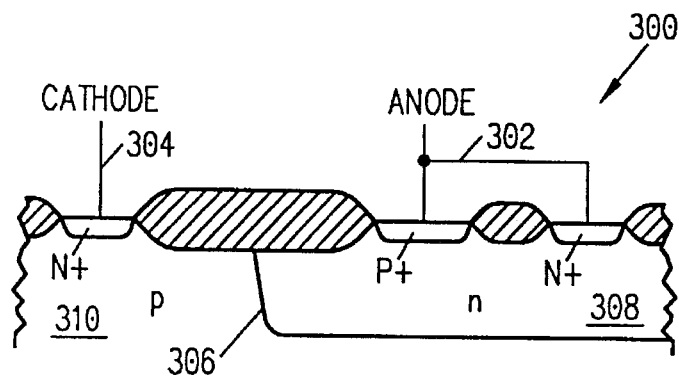
FIG. 3 is a sectional view illustrating a first prior art SCR structure utilizable for ESD protection.
Figure 4:
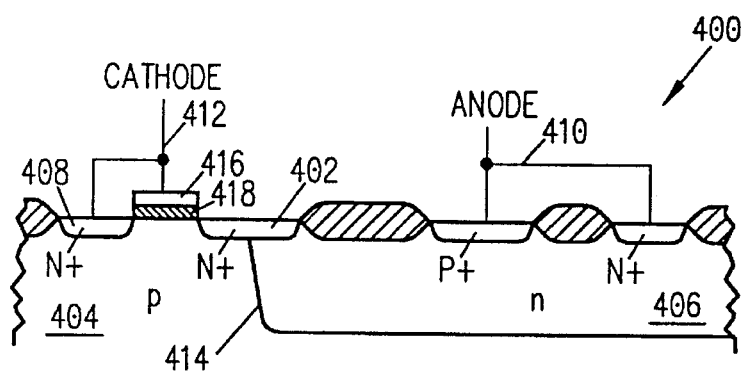
FIG. 4 is a sectional view illustrating a second prior art SCR structure utilizable for ESD protection.
Figure 5:
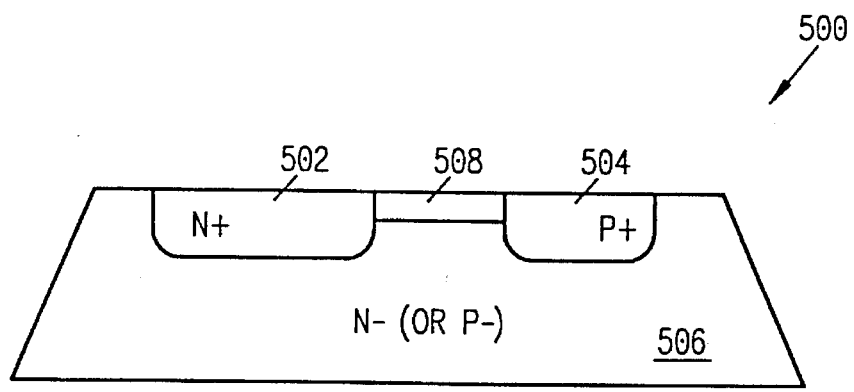
FIG. 5 is a sectional view illustrating a prior art zener diode structure utilizable for ESD protection.
Figure 6:
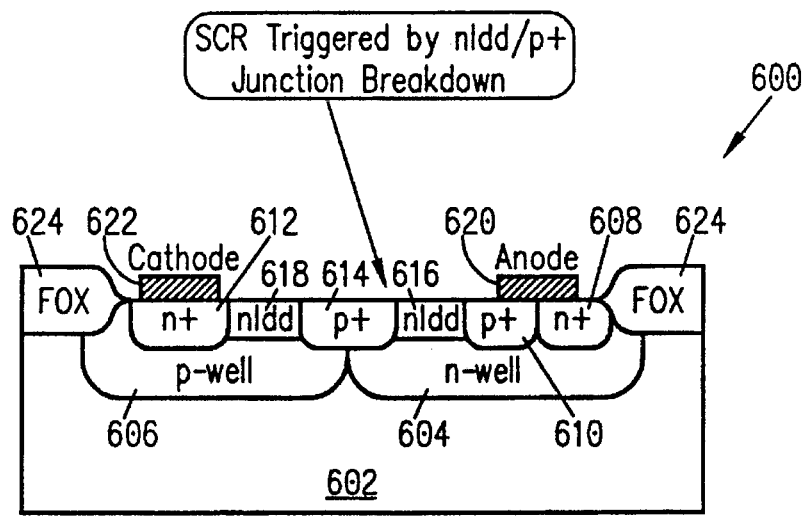
FIG. 6 is a sectional view illustrating a SCR structure in accordance with the present invention that ; is triggered by nLDD/p+ junction breakdown.

FIG. 6 shows a SCR structure 600 for electrostatic discharge protection in an integrated circuit. The SCR structure 600 is formed in a semiconductor substrate 602 than can be either p– or p– on p+ conductivity. The substrate is tied to common ground (not shown). The SCR structure 600 includes a first well 604 of N-type conductivity and a second well 606 of P-type conductivity. The N-well 604 and P-well 606 are formed in the substrate 602 adjacent to each other to define a first junction therebetween. A first heavily doped region 608 of N-type conductivity is formed in the N-well 604. A second heavily doped region 610 of P-type conductivity is formed in the N-well 604 adjacent to the first heavily dope region 608 to define a second junction between the N-type region 608 and P-type region 610. A third heavily doped region 612 of N-type conductivity is formed in the P-well 606. A fourth heavily doped region 614 of P-type conductivity is formed in the semiconductor substrate to span the first junction between the N-well 604 and the P-well 606. A first lightly doped region 616 of N-type conductivity is formed in the N-well 604 between the second heavily dope region 610 and the fourth heavily doped region 614. A second lightly doped region 618 of N-type conductivity is formed in the P-well 606 between the third heavily doped region 612 and the fourth heavily doped region 614. An anode 620 is formed over the second junction between the first heavily doped region 608 and the second heavily doped region 610. A cathode is formed over the third heavily doped region 612. Field oxide 624 isolates the SCR structure 600 from laterally adjacent structures on the integrated circuit die.

Figure 6A:
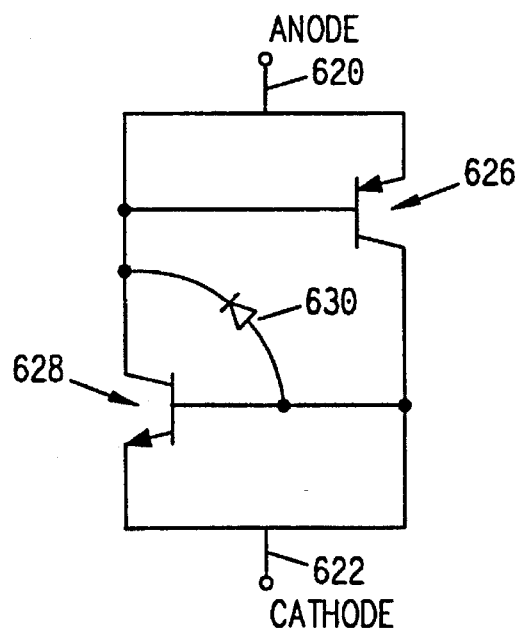
FIG. 6A is a schematic diagram illustrating a circuit equivalent to the FIG. 6 SCR structure.

A circuit equivalent to the FIG. 6 SCR structure 600 is shown in FIG. 6A. The FIG. 6A circuit includes pnp transistor 626, npn transistor 628 and a low breakdown voltage diode 630. As related to the SCR structure 600, the pnp transistor 626 has its emitter as heavily doped p+ region 610, its based as n-well region 604 and its collector as p-well region 606. The npn transistor 628 has its emitter as heavily doped n+ region 622, its base as a p-well region 606 and its collector as n-well region 604. The low breakdown voltage diode 630 is formed by heavily doped p+ region 614 and lightly doped n+ region 616.

Current flow in the SCR structure 600 is triggered by junction breakdown of the diode 630. The trigger voltage $V_{tr}$ for junction breakdown may be expressed as follows:

$$V_{tr} \approx 2 \cdot V_f + V_{BR}, \text{ where}$$

Figure 7:
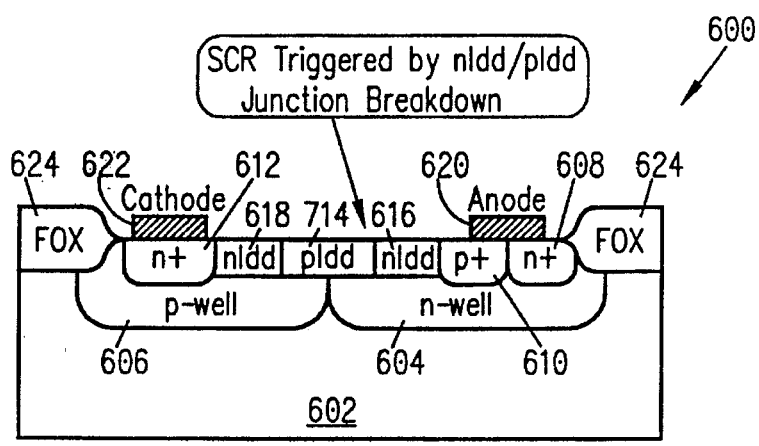
FIG. 7 is a sectional view illustrating a SCR structure in accordance with the present invention that is triggered by nLDD/pLDD junction breakdown.

$V_f$=diode forward bias voltage drop ~0.7 V
and
$V_{Br}$=reverse breakdown voltage ~7 V thus, $V_{tr}=2\cdot(0.7)+7 \approx 8.4$ V FIG. 7 shows a SCR structure 700 which is structurally identical to the FIG. 6 SCR structure with the exception that the fourth heavily doped region 614 in the FIG. 6 structure 600 is replaced by a lightly doped region 714 (PLDD) of P-type conductivity. The remaining structural features of the FIG. 7 structure 700 are numerically identified in a manner similar to the FIG. 6 structure 600.

Figure 8:
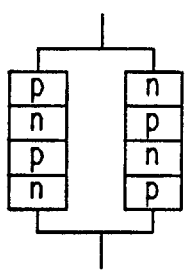
FIG. 8 shows merged pnpn and npnp SCR structures for use in both forward and reverse operation ESD protection.
Figure 10:
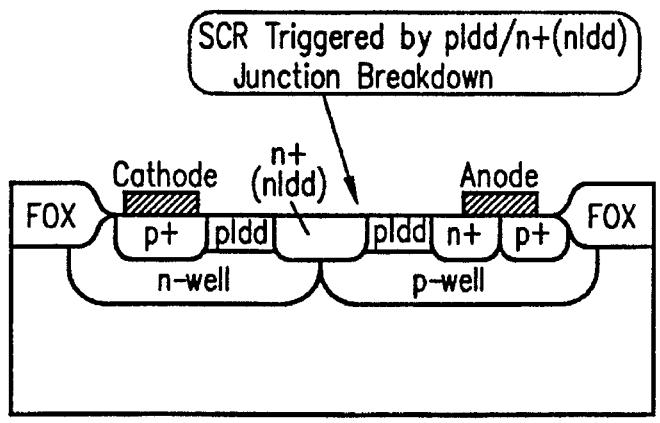
FIG. 10 is a sectional view illustrating a SCR structure complementary to that shown in FIG. 6.

FIG. 8 provides a simple schematic representation of a merged pnpn/npnp low trigger voltage triac structure that utilizes the concepts of the present invention to provide ESD protection for both forward and reverse operation. In accordance with the invention, the FIG. 6 structure 600 is utilized for the pnpn structure of the triac and its compliment, shown in FIG. 10, forms the npnp structure of the triac. In the FIG. 10 structure, the cathode is tied to ground and the anode is biased at negative voltage.

Figure 9:
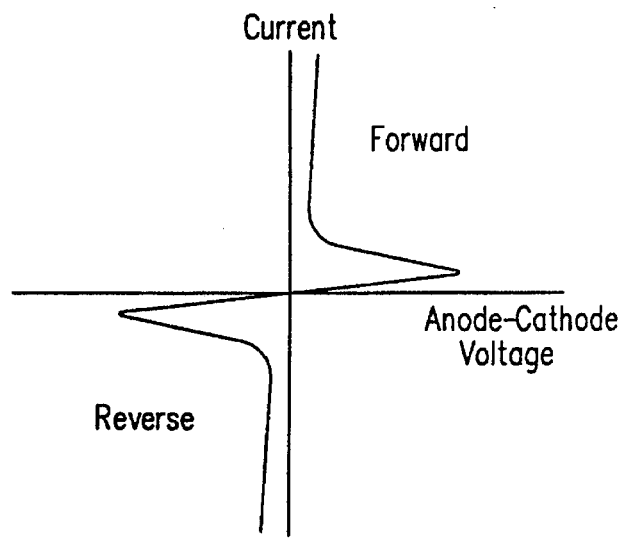
FIG. 9 is a graph illustrating anode-cathode voltage versus SCR current for the FIG. 8 merged structure.

FIG. 9 illustrates anode-cathode voltage versus SCR current for the triac shown in FIG. 8.

Those skilled in the art will appreciate that the SCR structures described above can be fabricated utilizing a conventional CMOS process flow that utilizes nLDD/pLDD implants or by adding a masking step to a conventional CMOS process flow to introduce the nLDD/pLDD implant.

It should be understood that various alternatives to the embodiment of the invention described above may be employed in practicing the invention. It is intended that the following claims define the scope of the invention and that structures within the scope of these claims and their equivalents be covered thereby.

What is claimed is:

1. A silicon controlled rectifier (SCR) structure formed in a semiconductor substrate and utilizable for electrostatic discharge protection, the SCR structure comprising:

a first well of a first conductivity type formed in the semiconductor substrate;

a second well of a second conductivity type formed in the semiconductor substrate adjacent to the first well to define a first junction between the first and second wells;

a first heavily doped region of the first conductivity type formed in the first well;

a second heavily doped region of the second conductivity type formed in the first well adjacent to the first heavily doped region to define a second junction between the first and second heavily doped regions;

a third heavily doped region of the first conductivity type formed in the second well;

a fourth heavily doped region of the second conductivity type formed to span the first junction between the first and second wells;

a first lightly doped region of the first conductivity type formed in the first well between the second heavily doped region and the fourth heavily doped region;

a second lightly doped region of the first conductivity type formed in the second well between the third heavily doped region and the fourth heavily doped region;

a conductive anode formed over the second junction between the first and second heavily doped regions and in electrical contact therewith;

a conductive cathode formed over the third heavily doped region and in electrical contact therewith.

2. A silicon controlled rectifier (SCR) structure formed in a semiconductor substrate and utilizable for electrostatic discharge protection, the SCR structure comprising:

a first well of a first conductivity type formed in the semiconductor substrate;

a second well of a second conductivity type formed in the semiconductor substrate adjacent to the first well to define a first junction between the first and second wells;

a first heavily doped region of the first conductivity type formed in the first well;

a second heavily doped region of the second conductivity type formed in the first well adjacent to the first heavily doped region to define a second junction between the first and second heavily doped regions;

a third heavily doped region of the first conductivity type formed in the second well;

a first lightly doped region of the second conductivity type formed to span the first junction between the first and second wells;

a second lightly doped region of the first conductivity type formed in the first well between the second heavily doped region and the first lightly doped region;

a third lightly doped region of the first conductivity type formed in the second well between the third heavily doped region and the first lightly doped region;

a conductive anode formed over the second junction between the first and second heavily doped regions and in electrical contact therewith; and a conductive cathode formed over the third heavily doped region and in electrical contact therewith.

3. A triac structure formed in a semiconductor substrate and utilizable for electrostatic discharge protection, the triac structure comprising:

(a) a first silicon controlled rectifier (SCR) structure that includes a first well of n-type conductivity formed in the semiconductor substrate;

a second well of p-type conductivity formed in the semiconductor substrate adjacent to the first well to define a first junction between the first and second wells;

a first heavily doped n+ region formed in the first well;

a second heavily doped p+ region formed in the first well adjacent to the first heavily doped n+ region to define a second junction between the first and second heavily doped regions;

a third heavily doped n+ region formed in the second well;

a fourth heavily doped p+ region formed to span the first junction between the first and second wells;

a first nLDD region formed in the first well between the second heavily doped region and the fourth heavily doped region;

a second nLDD region formed in the second well between the third heavily doped region and the fourth heavily doped region;

a conductive anode formed over the second junction between the first and second heavily doped regions and in electrical contact therewith;

a conductive cathode formed over the third heavily doped region and in electrical contact therewith; and (b) a second silicon controlled rectifier (SCR) structure that includes a first well of p-type conductivity formed in the semiconductor substrate;

a second well of n-type conductivity formed in the semiconductor substrate adjacent to the first well to define a first junction between the first and second wells;

a first heavily doped p+ region formed in the first well;

a second heavily doped n+ region formed in the first well adjacent to the first heavily doped region to define a second junction between the first and second heavily doped regions;

a third heavily doped p+ region formed in the second well;

a fourth heavily doped n+ region formed to span the first junction between the first and second wells;

a first pLDD region formed in the first well between the second heavily doped region and the fourth heavily doped region;

a second pLDD region of the first conductivity type formed in the second well between the third heavily doped region and the fourth heavily doped region;

a conductive anode formed over the second junction between the first and second heavily doped regions and in electrical contact therewith; and a conductive cathode formed over the third heavily doped region and in electrical contact therewith.

4. A triac structure formed in a semiconductor substrate and utilizable for electrostatic discharge protection, the triac structure comprising:

(a) a first silicon controlled rectifier (SCR) structure that includes a first well of n-type conductivity formed in the semiconductor substrate;

a second well of p-type conductivity formed in the semiconductor substrate adjacent to the first well to define a first junction between the first and second wells;

a first heavily doped n+ region formed in the first well;

a second heavily doped p+ region formed in the first well adjacent to the first heavily doped region to define a second junction between the first and second heavily doped regions;

a third heavily doped n+ region formed in the second well;

a first pLDD region formed to span the first junction between the first and second wells;

a second nLDD region formed in the first well between the second heavily doped region and the first pLDD region;

a third nLDD region formed in the second well between the third heavily doped region and the first pLDD region;

a conductive anode formed over the second junction between the first and second heavily doped regions and in electrical contact therewith;

a conductive cathode formed over the third heavily doped region and in electrical contact therewith; and (b) a second silicon controlled rectifier (SCR) structure that includes
  a first well of p-type conductivity formed in the semiconductor substrate;
  a second well of n-type conductivity formed in the semiconductor substrate adjacent to the first well to define a first junction between the first and second wells;
  a first heavily doped p+ region formed in the first well;
  a second heavily doped n+ region formed in the first well adjacent to the first heavily doped region to define a second junction between the first and second heavily doped regions;
  a third heavily doped p+ region formed in the second well;
  a first nLDD region formed to span the first junction between the first and second wells;
  a second pLDD region formed in the first well between the second heavily doped region and the first nLDD region;
  a third lightly doped region of the first conductivity type formed in the second well between the third heavily doped region and the first lightly doped region;
  a conductive anode formed over the second junction between the first and second heavily doped regions and in electrical contact therewith; and
  a conductive cathode formed over the third heavily doped region and in electrical contact therewith.

* * * * *